(12) United States Patent
Nishiyama

(10) Patent No.: US 10,338,147 B2
(45) Date of Patent: Jul. 2, 2019

(54) METHODS AND APPARATUS FOR DETERMINING A RELATIVE STATE OF CHARGE OF A BATTERY

(71) Applicant: SEMICONDUCTOR COMPONENTS INDUSTRIES, LLC, Phoenix, AZ (US)

(72) Inventor: Yoshinobu Nishiyama, Ota (JP)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 168 days.

(21) Appl. No.: 15/338,622

(22) Filed: Oct. 31, 2016

(65) Prior Publication Data

US 2018/0120383 A1    May 3, 2018

(51) Int. Cl.
  *G01R 31/367*  (2019.01)
  *G01R 31/382*  (2019.01)
  *H01M 10/48*  (2006.01)
(52) U.S. Cl.
  CPC ......... *G01R 31/367* (2019.01); *G01R 31/382* (2019.01); *H01M 10/48* (2013.01)
(58) Field of Classification Search
  CPC .................................................. G01R 31/3651
  USPC .......................................................... 702/63
  See application file for complete search history.

(56) References Cited

U.S. PATENT DOCUMENTS

| | | | |
|---|---|---|---|
| 2007/0120554 A1 | 5/2007 | Kawakami | |
| 2011/0074433 A1* | 3/2011 | Zhang | G01R 31/396 324/429 |
| 2011/0133697 A1* | 6/2011 | Matsuura | H02J 7/0021 320/132 |
| 2011/0169459 A1* | 7/2011 | Chen | H02J 7/0057 320/160 |
| 2012/0049802 A1 | 3/2012 | Barsukov | |
| 2012/0130661 A1 | 5/2012 | Hagimori | |
| 2014/0042986 A1* | 2/2014 | Chen | H02J 7/007 320/162 |
| 2015/0032394 A1 | 1/2015 | Kimura | |
| 2015/0046105 A1 | 2/2015 | Guntreddi | |
| 2016/0109529 A1* | 4/2016 | Meacham | H02J 7/0047 702/63 |

FOREIGN PATENT DOCUMENTS

| | | | | |
|---|---|---|---|---|
| CN | 103852725 A | * | 6/2014 | ......... G01R 31/3606 |
| JP | 09322420 | | 12/1997 | |
| JP | 2007285739 | | 11/2007 | |
| JP | 2013178166 | | 2/2012 | |
| JP | 2013135510 | | 7/2013 | |
| JP | 2014010005 | | 1/2014 | |
| JP | 2015062325 | | 4/2015 | |

* cited by examiner

*Primary Examiner* — Ricky Ngon
(74) *Attorney, Agent, or Firm* — The Noblitt Group, PLLC; Hettie L. Haines

(57) ABSTRACT

Various embodiments of the present technology may comprise methods and apparatus for determining a relative state of charge of battery. According to various embodiments, the methods and apparatus may operate to establish continuity between the RSOC values that are computed before and after a change in the charge mode of the battery. During a constant voltage charge mode, the methods and apparatus further estimate the RSOC value according to a linear relationship between the charging current and the RSOC.

17 Claims, 8 Drawing Sheets

METHODS AND APPARATUS FOR DETERMINING A RELATIVE STATE OF CHARGE OF A BATTERY

BACKGROUND OF THE TECHNOLOGY

Rechargeable batteries, such as a lithium ion battery, are widely used as driving batteries for a variety of devices, such as a cellular phone, a notebook computer, and the like, due to particular battery characteristics, such as having a large capacity, a high energy density, and ability to efficiently charge and discharge.

Lithium ion batteries are generally charged by a combined constant current and constant voltage technique. In particular, the battery may be initially charged with a constant current until the battery voltage reaches a predetermined voltage value. Once this voltage is reached, the charger maintains a constant charge voltage as the current decreases. Charging is complete when the current reaches a terminal current value.

Many battery systems are equipped with circuitry to compute the remaining capacity of the battery (typically measured in Amp-hr). The remaining capacity may be expressed as a percentage of the full charge capacity (maximum capacity) of the battery. This percentage value is referred to as the relative state of charge (RSOC) of the battery. Electronic devices typically display this percentage value to inform a user of the amount of stored energy available for use.

The full charge capacity of the battery, however, decreases with age and cannot be easily measured. Many battery systems have various circuits and components to estimate the full charge capacity of the battery but these estimates contain a margin of error. This margin of error is then propagated to the RSOC value. Conventional battery systems may also employ look-up tables to adjust the RSOC value in an attempt to correct the error. Look-up tables, however, occupy a large storage area and require more power to retrieve data from the look-up table.

Battery systems generally compute the RSOC value of the battery using different methods depending on the charge mode (constant current charge mode or constant voltage charge) of the battery. It is during the switch from one mode to another that the RSOC error is most noticeable.

SUMMARY OF THE INVENTION

Various embodiments of the present technology may comprise methods and apparatus for determining a relative state of charge of battery. According to various embodiments, the methods and apparatus may operate to establish continuity between the RSOC values that are computed before and after a change in the charge mode of the battery. During a constant voltage charge mode, the methods and apparatus further estimate the RSOC value according to a linear relationship between the charging current and the RSOC.

BRIEF DESCRIPTION OF THE DRAWINGS

A more complete understanding of the present technology may be derived by referring to the detailed description when considered in connection with the following illustrative figures. In the following figures, like reference numbers refer to similar elements and steps throughout the figures.

DETAILED DESCRIPTION OF EXEMPLARY EMBODIMENTS

The present technology may be described in terms of functional block components and circuit diagrams. Such functional blocks and circuit diagrams may be realized by any number of components configured to perform the specified functions and achieve the various results. For example, the present technology may employ various types of storage devices, battery chargers, current sensors, analog-to-digital converts, logic units, and the like, which may carry out a variety of functions. The methods and apparatus for determining a relative state of charge of battery a according to various aspects of the present technology may operate in conjunction with any system and/or device that operates with a rechargeable battery, such as a cellular phone, a gaming device, a television, a personal computer, a vehicle system, and the like.

Figure 1:
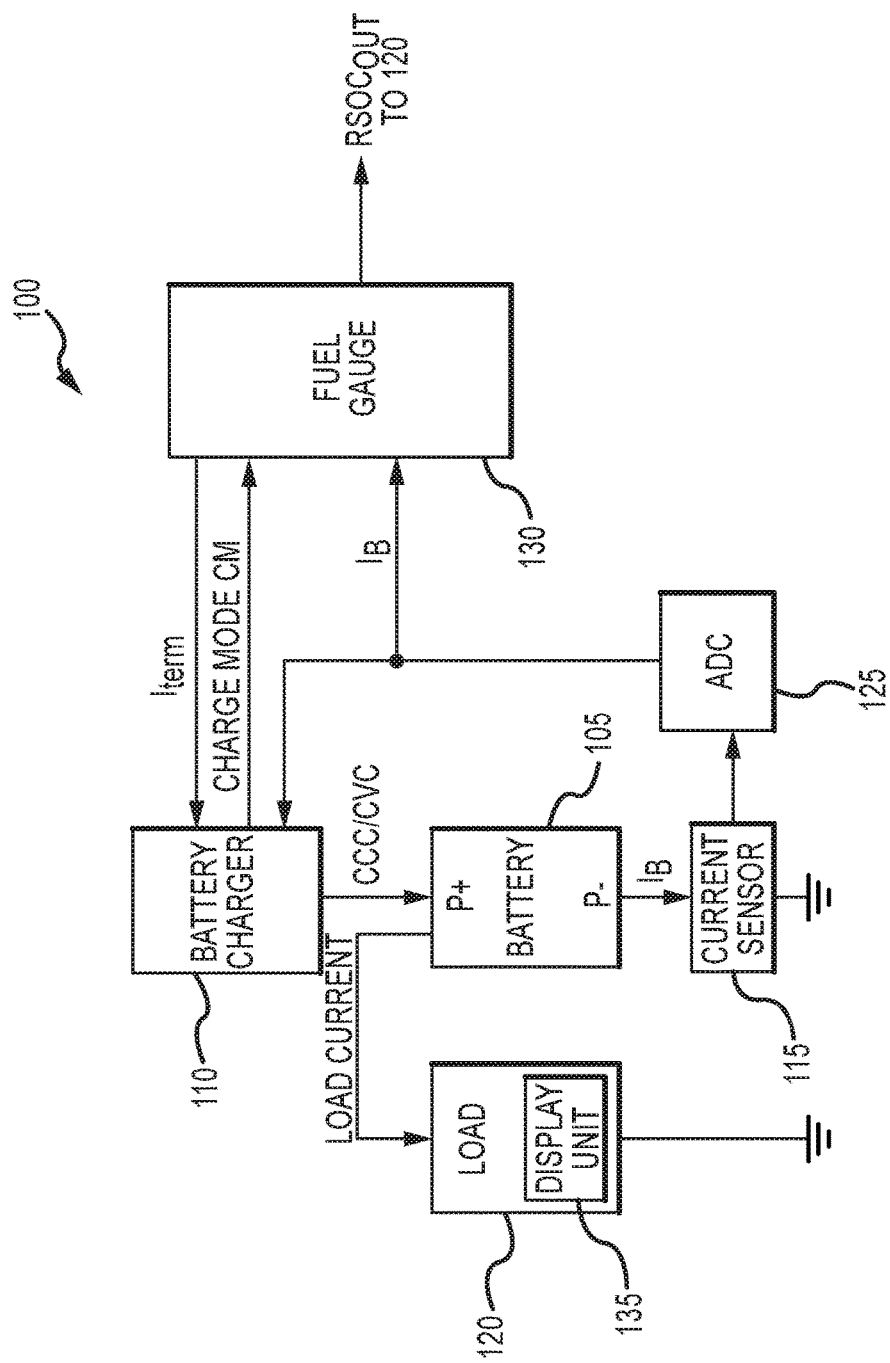
FIG. 1 is a block diagram of a battery system in accordance with an exemplary embodiment of the present technology.

Referring to FIG. 1, in an exemplary embodiment of the present technology, methods and apparatus for determining a relative state of charge (RSOC) of a battery may operate in conjunction with a system 100 configured to measure a battery current $I_B$ and/or battery voltage, charge the battery 105 according to a charge mode CM, compute a relative state of charge of the battery 105, and report the RSOC value to other operational components of the system and/or to the user of the device and/or system. According to various embodiments, the system 100 may comprise a load 120 electrically coupled to a battery 105, a battery charger 110, a current sensor 115 coupled to the battery 105, and an analog-to-digital converter (ADC) 125.

In an exemplary embodiment, the battery 105 may comprise any suitable accumulator device providing stored energy such as a rechargeable battery incorporating materials such as lithium ion, lithium ion polymer, and the like. The battery 105 may be selected according to a particular application and may have a particular set of design specifications, such as a design capacity DC, a terminal current $I_{term}$, and a maximum charging voltage.

The battery may be coupled to the load 120 to deliver power to the load 120. The load 120 may comprise any device or system requiring electricity to operate. For example, the load 120 may comprise a cellular phone, a vehicle, or other device suitably operated in conjunction with the battery 105. In various embodiments, the load 120 may comprise or be coupled to a display unit 130 configured to report and/or display various battery data to the user. The display unit 112 may comprise a display screen, such as a liquid crystal panel, or other display system suitable to display characters, images, and the like.

The current sensor 115 may comprise any device or system for sensing, detecting, calculating, and/or identifying an electrical current. The current sensor 115 may comprise various components configured to detect the battery current $I_B$. For example, the current sensor 115 may comprise a shunt resistor and an operational amplifier. The current sensor 115 may be selected according to a desired application and/or output function. The current sensor 115 may also be configured to transmit an output signal representing the detected battery current $I_B$.

The current sensor 115 may be coupled to the ADC 125, wherein the ADC 125 is configured to receive the output signal from the current sensor 115 and convert the signal into a digital signal. The ADC 125 may comprise any suitable analog-to-digital architecture, and may be selected based on a particular application.

The battery charger 110 may be used to restore energy to the battery 105. The battery charger 110 may comprise any suitable type of charging device such as: an alternating current charger; an inductive charger; a motion powered charger; a trickle charger; a USB charger; and the like. The battery charger 110 may be coupled to the ADC 125 to receive data representing the battery current $I_B$, and may measure the battery voltage. The battery charger 110 may be configured to utilize the battery current $I_B$ and/or voltage data to determine the charge mode CM for the battery 105.

Figure 5:
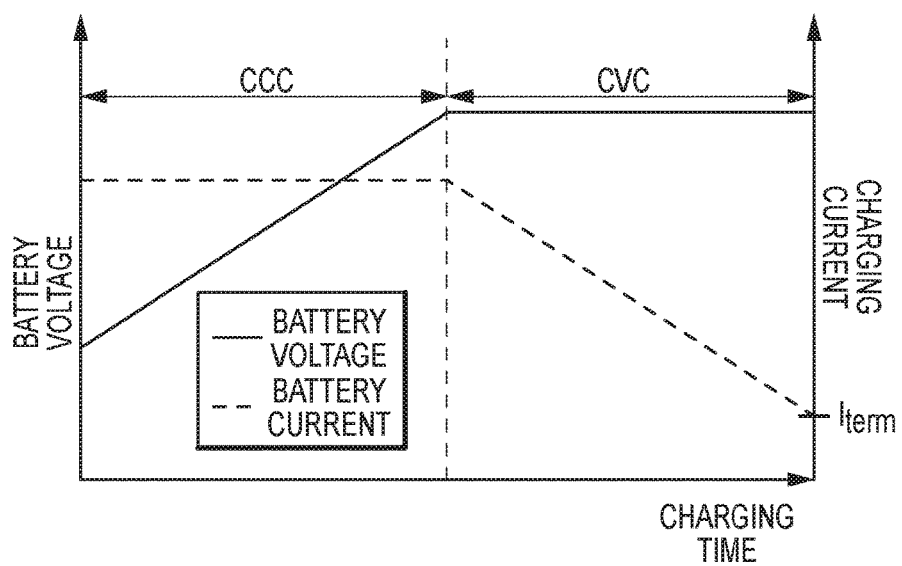
FIG. 5 representatively illustrates a charging operation of a battery in accordance with an exemplary embodiment of the present technology.

In various embodiments, and referring to FIG. 5, the battery charger 110 may be configured to charge the battery 105 using multiple charging modes in response to the signal from the current sensor 115. For example, in response to a first signal from the current sensor 115, the battery charger 110 may charge the battery 105 in a constant current charge (CCC) mode for a period of time, wherein the charging current is kept constant until the battery 105 reaches a predetermined voltage value. When the battery 105 reaches the predetermined voltage, the current sensor 115 may provide a second signal to the battery charger 110 causing the battery charger 110 to stop charging in CCC mode and switch to a constant voltage charge (CVC) mode. During CVC mode, the battery charger 110 charges the battery 105 with a decreasing current for a second period of time until the battery 105 reaches the terminal current $I_{term}$. When the terminal current $I_{term}$ is reached, the battery charger 110 stops charging the battery 105 in response to a third signal from the current sensor 115. The terminal current $I_{term}$ is a predetermined value based on the particular battery specifications and application. A total charge period may be defined as the time period of the CCC mode plus the time period of the CVC mode.

Figure 2:
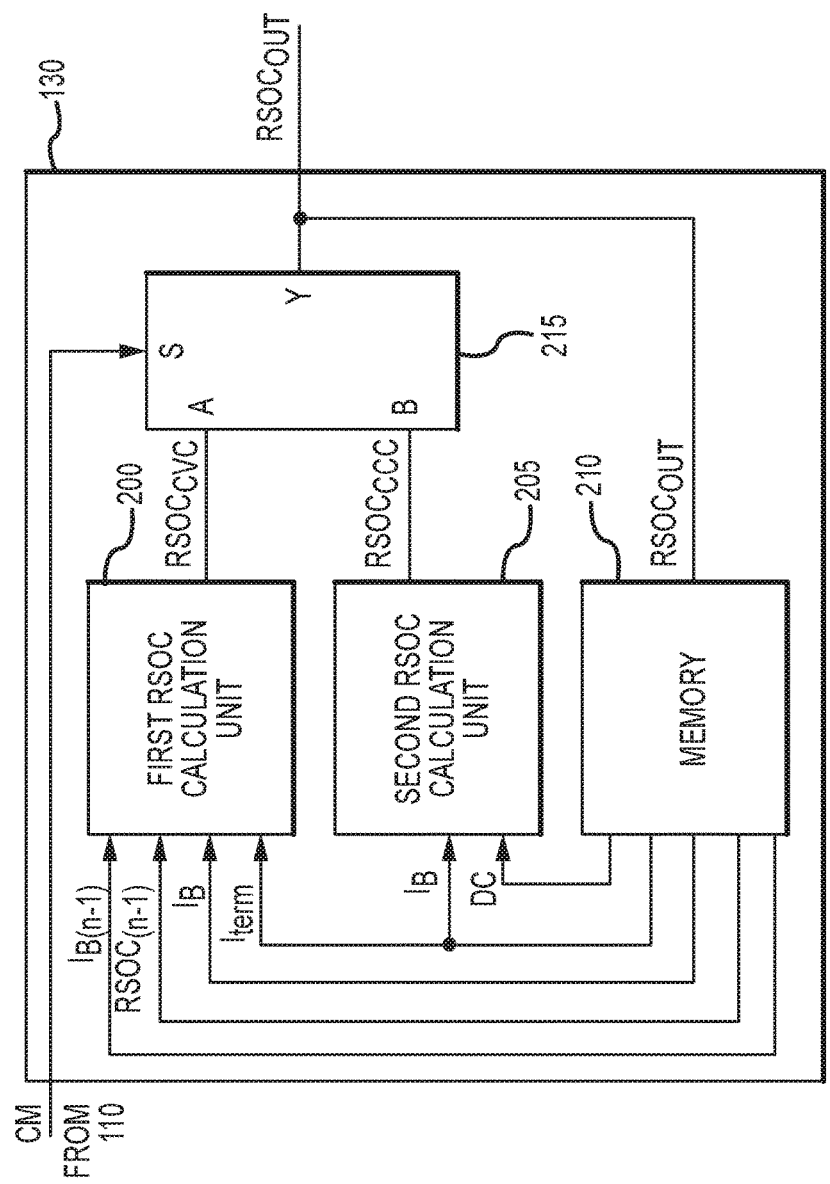
FIG. 2 is a block diagram of a battery fuel gauge in accordance with an exemplary embodiment of the present technology.
Figure 3:
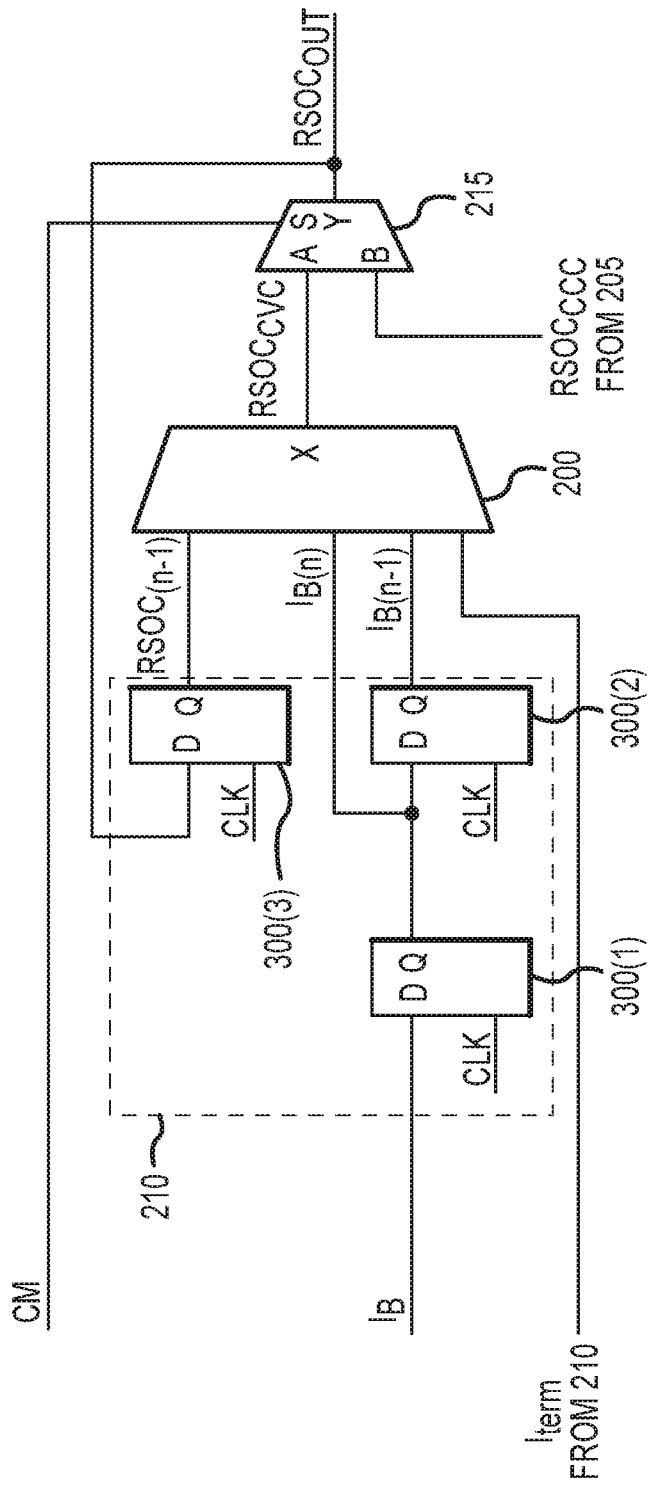
FIG. 3 is a circuit diagram of a battery fuel gauge in accordance with an exemplary embodiment of the present technology.

Referring to FIGS. 1, 2, and 3, according to various embodiments, the system 100 may further comprise a fuel gauge 130 configured to store various data relating to the battery 105, such as the terminal current $I_{term}$ and the design capacity DC, and compute the RSOC value of the battery 105. The fuel gauge 130 may further be configured to control the transfer of various battery data according to a clock signal CLK. For example, the fuel gauge 130 may comprise a timing device (not shown) configured to produce the clock signal CLK, wherein various components of the system 100 are responsive to the clock signal CLK.

The fuel gauge 130 may comprise a memory unit 210 to store programs to be executed by the fuel gauge 130 and various types of battery data. The memory unit 210 may comprise any suitable memory system such as a hard disc drive, flash memory, removable media card, or some combination of multiple types of memory. The memory unit 210 may be configured to either permanently or temporarily store data. The memory unit 210 may also be accessed by any suitable external sources such as through a USB connection. The memory unit 210 may comprise any suitable memory type, such as ROM (read only memory) and/or RAM (random access memory), and comprise any suitable number of memory cells.

In various embodiments, the memory unit 210 may comprise a storage device 300, such a register, to load and store various data according to the clock signal CLK, wherein the storage device 300 is responsive to the clock signal CLK. For example, the memory unit 210 may comprise a first register 300(1) to store a new battery current $I_{B(n)}$ data, a second register 300(2) to store a previously-measured battery current $I_{B(n-1)}$, and a third register 300(3) to store a previously-computed RSOC (i.e., $RSOC_{(n-1)}$). During each clock cycle, the values in each of the first, second, and third registers 300(1), 300(2), 300(3) are updated according to new battery data and/or previously-computed and/or measured battery data. Each register 300 may comprise any suitable number of digital circuits, flip-flops, gated latches, and like, according to the number of data bits.

The fuel gauge 130 may be coupled to the ADC 125 to receive battery current $I_B$ data from the current sensor 115. The fuel gauge 130 may further be coupled to the battery charger 110 to exchange data relating to the charge mode CM of the battery 105 and the terminal current $I_{term}$.

The fuel gauge 130 may further be coupled to the load 120 via an output terminal to display an output RSOC (i.e., RSOCout) on the display unit 135. The load 120 may utilize the RSOCout to determine whether to power down due to low battery capacity.

In various embodiments, the fuel gauge 130 may comprise a first RSOC calculation unit 200 configured to compute a first RSOC value of the battery 105 according to a first method, and a second RSOC calculation unit 205 configured to compute a second RSOC value of the battery 105 according to a second method. The fuel gauge 130 may operate the first and second RSOC calculation units 200, 205 according to the various programs and battery data stored in the memory unit 210. For example, the first and second RSOC calculation units 200, 205 may utilize stored battery data, such as the terminal current $I_{term}$, and the design capacity DC.

The first RSOC calculation unit 200 may be configured to receive input data, and perform various computations with the input data. An exemplary first RSOC calculation unit 200, computes the first RSOC (i.e., $RSOC_{CVC}$) based on measured battery current data and a previously-computed RSOC. The first RSOC calculation unit 200 may be realized with various hardware components and/or software to achieve a desired output.

Figure 4:
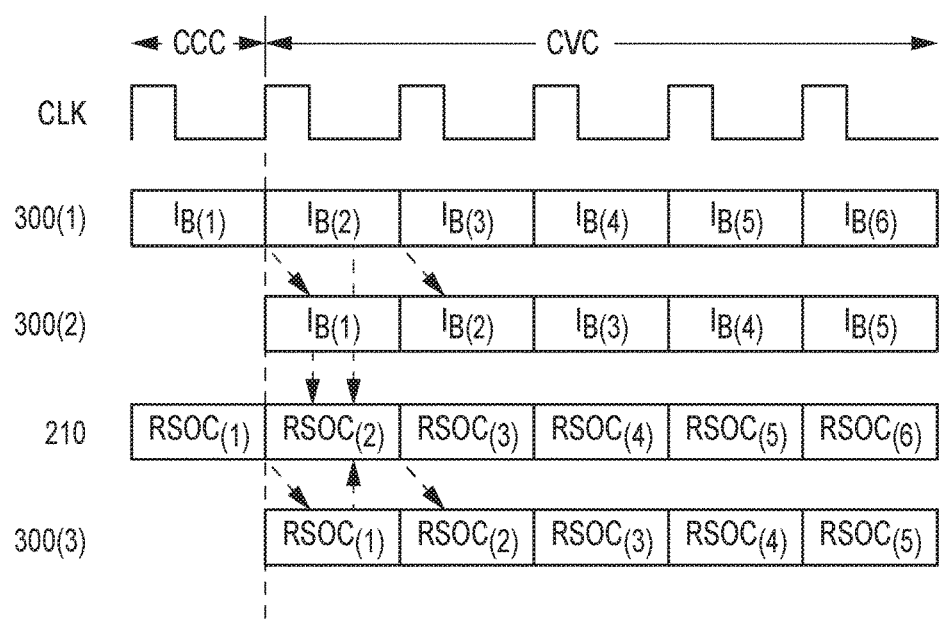
FIG. 4 a timing diagram of a battery fuel gauge in accordance with an exemplary embodiment of the present technology.
Figure 7:
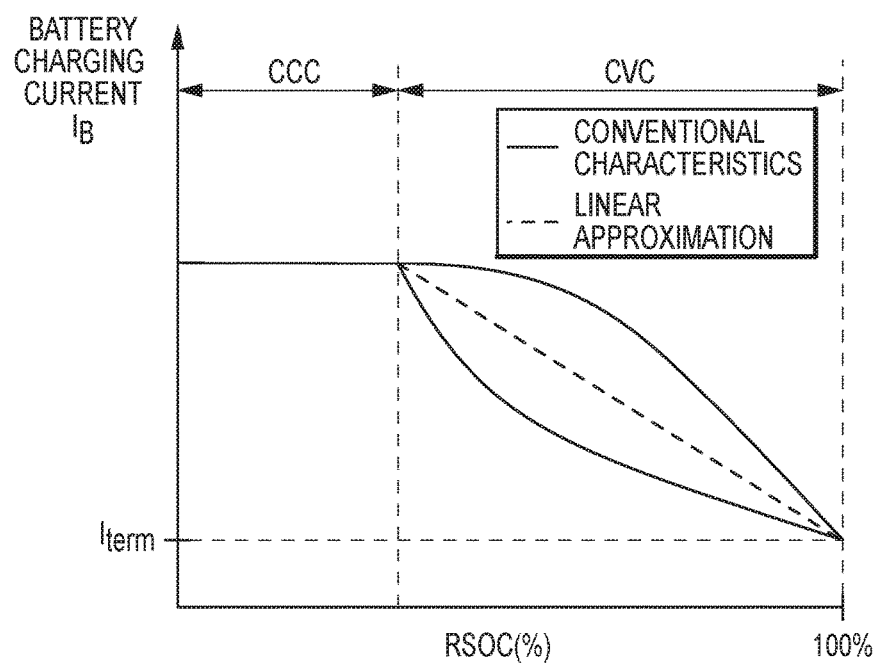
FIG. 7 graphically illustrates a relationship between the charging current of a battery and the relative state of charge in accordance with an exemplary embodiment of the present technology.
Figure 8:
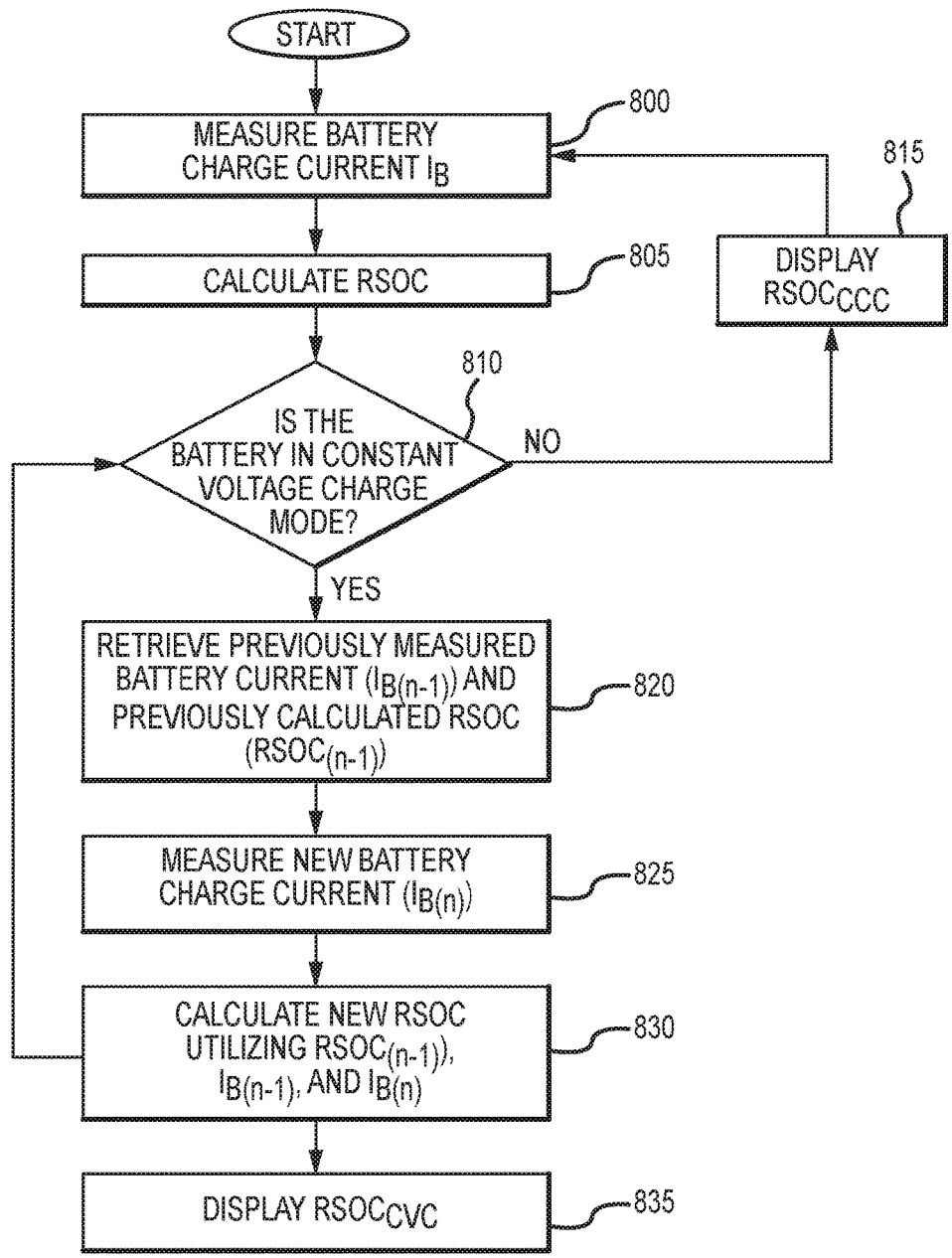
FIG. 8 is a flow chart for determining a relative state of charge of a battery in accordance with an exemplary embodiment of the present technology.

According to an exemplary embodiment, the first RSOC calculation unit 200 computes the first RSOC according to the following formula:

$$RSOC_{CVC} = 100 - \left[ (I_{B(n)} - I_{term}) \times \frac{100 - RSOC_{(n-1)}}{I_{B(n-1)} - I_{term}} \right],$$

where $I_{B(n)}$ is a newly-measured battery current, $I_{B(n-1)}$ is the battery current measured some time before $I_{B(n)}$ (i.e., previously-measured current), $I_{term}$ is the terminal current, and $RSOC_{(n-1)}$ is a previously-computed RSOC, which may be the first RSOC value or the second RSOC value. For example, and referring to FIG. 4, during a first clock cycle of the CVC mode and after the battery charger 110 switches from CCC to CVC mode, the previously-computed RSOC ($RSOC_{(n-1)}$) is equal to the RSOC value computed according to the second RSOC calculation unit, and in this case, the second RSOC value ($RSOC_{CCC}$). During a second, third, etc., clock cycles of the CVC mode, however, the previously-computed RSOC ($RSOC_{(n-1)}$) is equal to the RSOC value computed according to the first RSOC calculation unit, and in this case, the first RSOC value ($RSOC_{CVC}$). Subsequent $RSOC_{CVC}$ values are computed according to the same formula, where $RSOC_{(n-1)}$ is the previously-computed $RSOC_{CVC}$. A plot of the computed $RSOC_{CVC}$ values as the battery charges during the constant voltage charge mode demonstrates a linear relationship between the RSOC of the battery and the battery current, for example as illustrated in FIG. 7.

In the present embodiment, the first RSOC calculation unit 200 is coupled to the memory unit 210 to receive the data stored in the memory unit 210. For example, the first RSOC calculation unit 200 may receive the previously-computed $RSOC_{(n-1)}$, the newly-measured battery current $I_{B(n)}$, and the previously-measured battery current $I_{B(n-1)}$ as inputs. The first RSOC calculation unit 200 may further receive the terminal current $I_{term}$ data from the memory unit 210. The first RSOC calculation unit 200 then uses this data to compute the first RSOC, and outputs the first RSOC via an output terminal X.

In an exemplary embodiment, the second RSOC calculation unit 205 computes the second RSOC (i.e., $RSOC_{CCC}$) using conventional methods, such as the coulomb counting method utilizing the design capacity DC of the battery 105. By utilizing the design capacity DC to compute the second RSOC, the second RSOC is not influenced by ever-changing variables, such as aging and temperature. In addition, conventional systems that estimate the RSOC based on such variables require additional hardware circuitry and/or software to perform additional calculations and may increase the cost of the system. Other conventional methods, such as those utilizing the voltage of the battery 105, may also be used to compute the second RSOC.

The fuel gauge 130 may selectively transmit one of the first and second RSOC values to various components within the system 100 according to the charge mode CM of the battery charger 110 and battery 105. According to various embodiments, during the CVC mode, the fuel gauge 130 may compute the RSOC value according to a linear relationship between the RSOC and the battery current, and transmit the computed RSOC value to the load 120. During the CCC mode, the fuel gauge 130 may compute the RSOC value according to a coulomb counting method (i.e., a current integration method), and transmit the computed RSOC value to the load 120.

In an exemplary embodiment, the first and second RSOC calculation units 200, 205 may be coupled to and configured to transmit the computed first and second RSOCs, the $RSO_{CCVC}$ and $RSO_{CCCC}$, respectively, to a selector 215 (i.e., an output device). The selector 215 may be configured to selectively transmit data from the input terminals to an output terminal based on data received at a select terminal S. For example, the selector 215 may comprise a multiplexer, and may comprise any suitable number of inputs (e.g., input terminals A and B) and select terminals (e.g., select terminal S), and one output terminal Y.

The selector 215 may be coupled to the battery charger 110 via the select terminal S to receive data corresponding to the charge mode CM of the battery 105. In an exemplary embodiment, the selector 215 may select as its output the first RSOC or the second RSOC based on the charge mode CM of the battery charger 110. For example, if the battery charger 110 is charging the battery 105 in constant voltage charge mode, then the selector 215 will output the $RSOC_{CVC}$, and if the battery charger 100 is charging the battery 105 in constant current charge mode, then the selector 215 will output the $RSOC_{CCC}$.

Referring to FIGS. 1-4, and 8, in operation, the fuel gauge 130 may compute the battery RSOC according to two different methods during the total charging time. In an exemplary embodiment, the fuel gauge 130 transmits one of the RSOC values to the display unit 135 according to the charge mode. For example, during the CVC mode, the fuel gauge 130 transmits the $RSOC_{CVC}$ to the load 120, and during the CCC mode, the fuel gauge 130 transmits the $RSOC_{CCC}$ to the load 120. The fuel gauge 130 may compute each RSOC substantially simultaneously or according to the particular charge mode CM of the battery 105.

During a charging state, the battery 105 may begin charging according to the CCC mode. In this mode, the second RSOC calculation unit 205 receives the measured battery current $I_B$ (800) and the design capacity DC and computes the $RSOC_{CCC}$ (805) according to the coulomb courting method. For example, the second RSOC calculation unit 205 may retrieve the design capacity DC data from the memory unit 210. The second RSOC calculation unit 205 then transmits the computed $RSOC_{CCC}$ to the selector 215 via an output terminal.

The selector 215 then receives the $RSOC_{CCC}$ and data indicating the charge mode CM of the battery 105. If the battery 105 is in CCC mode (810), the fuel gauge 130 transmits the $RSOC_{CCC}$ to the display unit 135 (815). In this case, the RSOCout is equal to the $RSOC_{CCC}$. The current sensor 115 will continue to measure the battery current $I_B$ and compute the $RSOC_{CCC}$, and display the $RSOC_{CCC}$ until the selector 215 detects a change in the charge mode CM. During the CCC mode, the measured battery currents $I_B$ and computed $RSOC_{CCC}$ are stored in the memory unit 210. For example, the battery currents $I_B$ may be stored in the first and second registers 300(1), 300(2), where the first register 300(1) stores the newly-measured battery current $I_{B(n)}$ and the second register 300(2) stores a previously-measured battery current $I_{B(n-1)}$. In addition, the third register 300(3) may store the previously-computed RSOC ($RSOC_{(n-1)}$). Each register 300 may be continuously updated according to any suitable criteria such as predetermined time periods, current or voltage levels, charge level, or the like.

Substantially simultaneously or after a change in the charge mode CM, the first RSOC calculation unit 200 retrieves the previously-measured battery current $I_{B(n-1)}$ (e.g., a first battery current) from the second register 300(2), the previously-computed RSOC ($RSOC_{(n-1)}$) from the third register 300(3) (820), and the new battery current $I_{B(n)}$ (e.g., a second battery current) from the first register (825). The first RSOC calculation unit 200 computes the $RSOC_{CVC}$ based on the previously-measured battery current $I_{B(n-1)}$, the previously-computed RSOC ($RSOC_{(n-1)}$), and the new battery current $I_{B(n)}$ (830) according to the formula above.

When the selector 215 detects a change in the charge mode CM from the CCC mode to the CVC mode (820), the selector 215 selects the $RSOC_{CVC}$ as the RSOCout. The fuel gauge 130 then transmits the $RSOC_{CVC}$ to the display unit 135 (835). In this case, the RSOCout is equal to the $RSOC_{CCC}$, and this RSOC value is stored in the third register 300(3). The current sensor 115 continues to measure the battery current $I_B$, and the memory unit 210 continuously updates and stores the battery current data. The first RSOC calculation unit 200 continues to compute the $RSOC_{CVC}$ and store the RSOCout in the third register 300(3).

Figure 6:
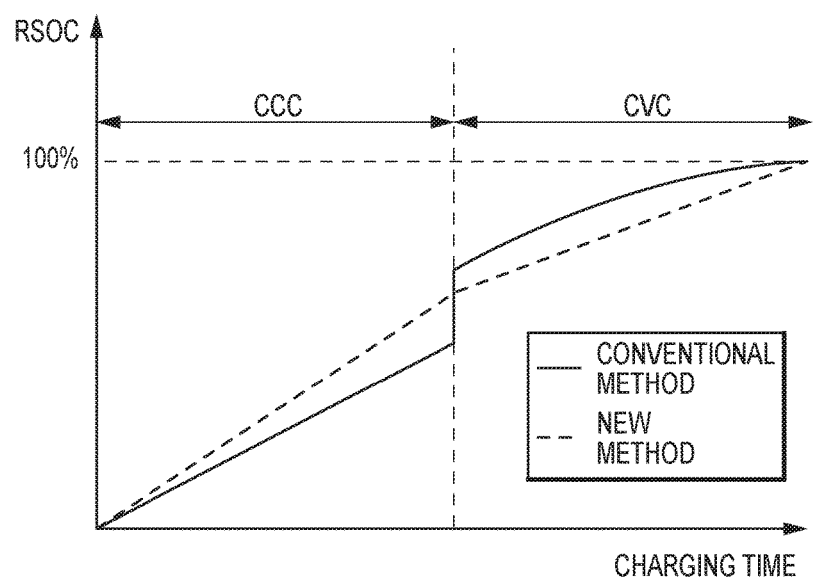
FIG. 6 graphically illustrates the relative state of charge of battery as a function of time in accordance with an exemplary embodiment of the present technology.

Referring to FIGS. 6 and 7, according to various embodiments of the present technology, during the CVC mode, the output RSOC value has a linear relationship to the battery current $I_B$. As such, the output RSOC values will exhibit continuity before and after a change in the charge mode. In contrast, conventional methods for computing an RSOC may result in a rapid increase in the RSOC value during a change in the charge mode, creating a point of discontinuity. This effect may be corrected with various measures, such as additional hardware circuitry and/or software, however, the added hardware circuitry and/or software generally increases the overall cost and/or complexity of the system.

The particular implementations shown and described are illustrative of the technology and its best mode and are not intended to otherwise limit the scope of the present technology in any way. Indeed, for the sake of brevity, conventional manufacturing, connection, preparation, and other functional aspects of the system may not be described in detail. Furthermore, the connecting lines shown in the various figures are intended to represent exemplary functional relationships and/or steps between the various elements. Many alternative or additional functional relationships or physical connections may be present in a practical system.

In the foregoing description, the technology has been described with reference to specific exemplary embodiments. Various modifications and changes may be made, however, without departing from the scope of the present technology as set forth. The description and figures are to be regarded in an illustrative manner, rather than a restrictive one and all such modifications are intended to be included within the scope of the present technology. Accordingly, the scope of the technology should be determined by the generic embodiments described and their legal equivalents rather than by merely the specific examples described above. For example, the steps recited in any method or process embodiment may be executed in any appropriate order and are not limited to the explicit order presented in the specific examples. Additionally, the components and/or elements recited in any system embodiment may be combined in a variety of permutations to produce substantially the same result as the present technology and are accordingly not limited to the specific configuration recited in the specific examples.

Benefits, other advantages and solutions to problems have been described above with regard to particular embodiments. Any benefit, advantage, solution to problems or any element that may cause any particular benefit, advantage or solution to occur or to become more pronounced, however, is not to be construed as a critical, required or essential feature or component.

The terms "comprises", "comprising", or any variation thereof, are intended to reference a non-exclusive inclusion, such that a process, method, article, composition or apparatus that comprises a list of elements does not include only those elements recited, but may also include other elements not expressly listed or inherent to such process, method, article, composition or apparatus. Other combinations and/or modifications of the above-described structures, arrangements, applications, proportions, elements, materials or components used in the practice of the present technology, in addition to those not specifically recited, may be varied or otherwise particularly adapted to specific environments, manufacturing specifications, design parameters or other operating requirements without departing from the general principles of the same.

The present technology has been described above with reference to an exemplary embodiment. However, changes and modifications may be made to the exemplary embodiment without departing from the scope of the present technology. These and other changes or modifications are intended to be included within the scope of the present technology.

The invention claimed is:

1. A circuit for computing an RSOC of a charging battery with a variable charging current, comprising:
   a fuel gauge circuit coupled to the battery, comprising:
   a current sense circuit responsive to the battery current and configured to measure a first battery current and a second battery current;
   a memory configured to store:
   the first battery current;
   the second battery current;
   a previously-computed RSOC value of the battery;
   a design capacity of the battery;
   a first RSOC calculation circuit coupled to the memory and configured to compute a first RSOC value based on the first and second battery currents, the previously-computed RSOC value, and a terminal current;
   a second RSOC calculation circuit coupled to the memory and configured to compute a second RSOC value utilizing the design capacity; and
   wherein the fuel gauge circuit is configured to maintain continuity among consecutively-reported RSOC values comprising reporting one of the first RSOC value and the second RSOC value based on a charge mode for the battery.

2. The circuit according to claim 1, wherein the previously-computed RSOC value is computed by the second RSOC calculation circuit during a constant current charge mode.

3. The circuit of according to claim 1, wherein the previously-computed RSOC value is computed by the first RSOC calculation circuit during a constant voltage charge mode.

4. The circuit according to claim 1, wherein the charge mode comprises a constant current charge mode and a constant voltage charge mode.

5. The circuit according to claim 4, wherein the fuel gauge circuit reports the first RSOC value if the battery is in the constant voltage charge mode, and reports the second RSOC value if the battery is in the constant current charge mode.

6. The circuit according to claim 1, further comprising an output device configured to select one of the first RSOC value and the second RSOC value and transmit the selected RSOC value to a display unit.

7. The circuit according to claim 1, wherein the second RSOC calculation circuit computes the second RSOC value according to a coulomb counting method.

8. The circuit according to claim 1, wherein the first RSOC calculation circuit computes the first RSOC value according to a linear relationship between the first RSOC value and the battery charging current during the constant voltage charge mode.

9. A method for computing an RSOC of a charging battery, comprising:

measuring a first battery current;
measuring a second battery current;
determining a charge mode of the battery, wherein the charge mode is one of a constant voltage charge mode and a constant current charge mode;
during the constant voltage charge mode, computing a first RSOC value based on a terminal current, the first battery current, the second battery current, and a previously-computed RSOC value, wherein the terminal current comprises a predetermined value and corresponds to a 100% RSOC value;
during the constant current charge mode, computing a second RSOC value by a coulomb counting method; and
reporting one of the first and second RSOC values to a display unit to maintain continuity among consecutively-reported RSOC values during a change in the charge mode comprising:
reporting the first RSOC value if the battery is in the constant voltage charge mode; and
reporting the second RSOC value if the battery is in the constant current charge mode.

10. The method of claim 9, wherein the previously-computed RSOC value is computed according to the coulomb counting method.

11. The method of claim 9, wherein the second RSOC value is computed based on a predetermined design capacity of the battery and a measured battery current over a predetermined period of time.

12. The method of claim 9, wherein the first RSOC value is computed to maintain a linear relationship between the first RSOC value and the battery current.

13. A system for computing an RSOC of a battery, comprising:
a current sense circuit coupled to the battery and configured to measure a current of the battery;
a battery charger coupled to the battery and the current sense unit, and configured to transmit data corresponding to a charge mode for the battery, wherein the charge mode for the battery is one of a constant current charge mode and a constant voltage charge mode; and
a fuel gauge circuit, coupled to the battery charger and the current sense circuit, comprising:
a memory configured to store:
a first battery current;
a second battery current; and
a previously-computed RSOC value;
a first RSOC calculation circuit coupled to the memory and configured to compute a first RSOC value during the constant voltage charge mode, wherein the first RSOC value is based on:
a predetermined terminal current, wherein the predetermined terminal current corresponds to a 100% RSOC,
the first and second battery currents, and
a previously-computed RSOC value;
a second RSOC calculation circuit coupled to the memory and configured to compute a second RSOC value during the constant current charge mode, wherein the second RSOC value is computed according to a computation different from the first RSOC calculation circuit; and
wherein the fuel gauge circuit is configured to report one of the first RSOC value and the second RSOC value to a display unit to maintain continuity between the previously-computed RSOC value and the one of the first and second RSOC values.

14. The system of claim 13, wherein the previously-computed RSOC value is computed during the constant current charge mode by the second RSOC calculation circuit.

15. The system of claim 13, wherein the previously-computed RSOC value is computed by the first RSOC calculation circuit during a constant voltage charge mode.

16. The system of claim 13, wherein the second RSOC value is computed based on the battery current and a predetermined design capacity of the battery and according to a coulomb counting method.

17. The system of claim 13, wherein the first RSOC calculation circuit computes the first RSOC value to maintain a linear relationship between the first RSOC value and the battery current during the constant voltage charge mode.

* * * * *